United States Patent
Lee et al.

(10) Patent No.: US 8,338,836 B2
(45) Date of Patent: Dec. 25, 2012

(54) LIGHT EMITTING DEVICE FOR AC OPERATION

(75) Inventors: Keon Young Lee, Ansan-si (KR); Dae Sung Kal, Seongnam-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 204 days.

(21) Appl. No.: 12/513,803

(22) PCT Filed: Sep. 5, 2007

(86) PCT No.: PCT/KR2007/004269
§ 371 (c)(1),
(2), (4) Date: May 6, 2009

(87) PCT Pub. No.: WO2008/062942
PCT Pub. Date: May 29, 2008

(65) Prior Publication Data
US 2010/0032692 A1    Feb. 11, 2010

(30) Foreign Application Priority Data

Nov. 21, 2006    (KR) .................. 10-2006-0114976

(51) Int. Cl.
*H01L 29/18* (2006.01)

(52) U.S. Cl. .............. 257/88; 257/82; 257/E51.022; 438/22; 438/24; 438/46; 438/47

(58) Field of Classification Search .............. 257/88
See application file for complete search history.

(56) References Cited

U.S. PATENT DOCUMENTS 5,995,243 A * 11/1999 Kerschner et al. ............ 358/461
2001/0032985 A1 * 10/2001 Bhat et al. ..................... 257/88
2005/0253151 A1 * 11/2005 Sakai et al. ................... 257/79
2006/0202915 A1 * 9/2006 Chikugawa ................... 345/46

FOREIGN PATENT DOCUMENTS

| JP | 2005197292 A * | 7/2005 |
|---|---|---|
| KR | 10-2005-0074491 | 7/2005 |
| KR | 10-2006-0020089 | 3/2006 |
| KR | 10-2006-0020572 | 3/2006 |
| KR | 10-2006-0078820 | 7/2006 |
| WO | 2004-023568 | 3/2004 |

* cited by examiner

*Primary Examiner* — Ajay K Arora
(74) *Attorney, Agent, or Firm* — H.C. Park & Associates, PLC

(57) ABSTRACT

An AC light emitting device, in which a plurality of light emitting cells formed on a substrate are flip-bonded to a submount to be driven under an AC power source is disclosed. The light emitting device comprises a first serial array of light emitting cells, and a second serial array of light emitting cells, wherein the second serial array is connected in reverse parallel to the first serial array. Meanwhile, bonding patterns are formed on a submount substrate, and the light emitting cells of the first and second serial arrays are flip-bonded to the bonding patterns. Further, node connecting patterns are formed on the submount substrate, and connect the bonding patterns such that nodes corresponding to each other provided in the first and second serial arrays are electrically connected to each other. Accordingly, it is possible to provide an AC light emitting device which can prevent overvoltage from being applied to light emitting cells in the array to which reverse voltage is applied by bonding patterns and node connecting patterns formed on a submount substrate, thereby protecting the light emitting cells.

20 Claims, 3 Drawing Sheets

LIGHT EMITTING DEVICE FOR AC OPERATION

CROSS-REFERENCE TO RELATED APPLICATIONS

This application is the National Stage of International Application No. PCT/KR2007/004269, filed Sep. 5, 2007, and claims priority from and the benefit of Korean Patent Application No. 10-2006-0114976, filed on Nov. 21, 2006, which are both hereby incorporated by reference for all purposes as if fully set forth herein.

BACKGROUND OF THE INVENTION

1. Field of the Invention

The present invention relates to a light emitting device, and more particularly, to an AC light emitting device, wherein a plurality of light emitting cells formed on a substrate are flip-bonded to a submount to be driven under an AC power source.

2. Discussion of the Background

With the development of GaN based light emitting diodes (LEDs), the GaN based LEDs have considerably changed LED technologies. Currently, the GaN based LEDs are used for various applications such as a full-color LED display, an LED traffic light, a white LED, and the like. Recently, it has been expected that high-frequency white LEDs will substitute for fluorescent lamps. In particular, efficiency of white LEDs has reached the level similar to that of typical fluorescent lamps.

In general, an LED emits light by a forward current and requires the supply of a DC current. Hence, when the LED is connected directly to an AC power source, it is repeatedly turned on/off depending on the direction of a current. As a result, there is a problem in that the LED does not continuously emit light, and is easily broken by a reverse current.

To solve such a problem, an LED capable of being connected directly to a high-voltage AC power source has been disclosed in PCT Patent Publication No. WO 2004/023568 (A1), entitled "LIGHT-EMITTING DEVICE HAVING LIGHT-EMITTING ELEMENTS" by SAKAI et al.

According to PCT Patent Publication No. WO 2004/023568(A1), LEDs (light emitting cells) are two-dimensionally connected in series on a single insulative substrate such as a sapphire substrate, thereby forming an LED array. Such two LED arrays are in reverse parallel on the sapphire substrate. As a result, there is provided a single chip light emitting device, which can be directly driven by an AC power supply.

However, in the single chip AC light emitting device, since a plurality of light emitting cells connected in series to one another simultaneously operate, a considerable amount of heat is generated, and such generation of heat causes the light emitting efficiency of the light emitting cells to be degraded. Therefore, an AC light emitting device capable of dissipating heat generated from a chip is required.

Meanwhile, when LED arrays are connected in reverse parallel and operate under AC voltage, excessive reverse voltage is applied to light emitting cells in the array to which reverse voltage is applied, and thus, the light emitting cells may be broken down. FIGS. 26 and 27 in PCT Patent Publication No. WO 2004/023568(A1) disclose that the light emitting cells corresponding to each other provided in the respective LED arrays connected in reverse parallel share a negative electrode. Since the light emitting cells share the negative electrode, the same voltage as the voltage applied to the light emitting cells in the array to which forward voltage is applied is applied to the light emitting cells in the arrays connected in reverse parallel. Thus, it is possible to prevent overvoltage from being applied to the light emitting cells in the array to which reverse voltage is applied.

However, since the light emitting cells corresponding to each other provided in the respective arrays connected in reverse parallel share the negative electrode in PCT Patent Publication No. WO 2004/023568(A1), processes for forming the light emitting cells on a substrate, e.g., patterning processes, are complicated.

SUMMARY OF THE INVENTION

An object of the present invention is to provide an AC light emitting device capable of easily dissipating heat generated from a plurality of light emitting cells connected in series.

Another object of the present invention is to provide an AC light emitting device, in which processes of patterning light emitting cells on a substrate can be simplified and excessive reverse voltage can be prevented from being applied to the light emitting cells.

In order to achieve these objects, there is provided an AC light emitting device, in which a plurality of light emitting cells formed on a substrate are flip-bonded to a submount to be driven under an AC power source. The light emitting device comprises a first serial array of light emitting cells, and a second serial array of light emitting cells, wherein the second serial array is connected in reverse parallel to the first serial array. Meanwhile, bonding patterns are formed on a submount substrate, and the light emitting cells of the first and second serial arrays are flip-bonded to the bonding patterns. Further, node connecting patterns are formed on the submount substrate, and connect the bonding patterns such that nodes corresponding to each other provided in the first and second serial arrays are electrically connected to each other. Accordingly, heat generated as the light emitting cells operate can be easily dissipated through the submount substrate, and it is possible to prevent overvoltage from being applied to light emitting cells in the array to which reverse voltage is applied by the bonding patterns and the node connecting patterns, thereby simplifying the processes of forming light emitting cells on a substrate.

Meanwhile, the light emitting cells may comprise a first conductive-type semiconductor layer, a second conductive-type semiconductor layer positioned on a region of the first conductive-type semiconductor layer, and an active layer interposed between the first and second conductive-type semiconductor layers. The light emitting cells may be bonded to the bonding patterns through metal bumps.

The metal bumps may comprise first-type metal bumps for connecting the first conductive-type semiconductor layers of the light emitting cells and the bonding patterns, and second-type metal bumps for connecting the second conductive-type semiconductor layers of the light emitting cells and the bonding patterns. The first conductive-type semiconductor layer of one of the light emitting cells and the second conductive-type semiconductor layer of another of the light emitting cells adjacent thereto may be respectively connected on the same bonding pattern through the first-type and second-type metal bumps, thereby forming the first and second arrays.

Alternatively, the first conductive-type semiconductor layer of one of the light emitting cells and the second conductive-type semiconductor layer of another of the light emitting cells adjacent thereto may be connected by wires formed on the substrate, thereby forming the first and second serial arrays. At this time, the metal bumps connect the second conductive-type semiconductor layers and the bonding patterns. Accordingly, the first-type metal bumps for connecting the first conductive-type semiconductor layers and the bonding patterns may be omitted.

Meanwhile, the bonding patterns and the node connecting patterns may be formed through different processes, respectively, or they may be formed together using the same patterning processes.

According to embodiments of the present invention, since there is provided an AC light emitting device in which a plurality of light emitting cells are flip-bonded to a submount substrate, heat generated from the plurality of light emitting cells connected in series can be easily dissipated through the submount substrate. Further, since bonding patterns and node connecting patterns are formed on the submount substrate, it is possible to prevent excessive reverse voltage from being applied to the light emitting cells. In addition, since it is not required that the light emitting cells share negative electrodes, the processes of patterning light emitting cells on a substrate can be simplified.

Figure 1:
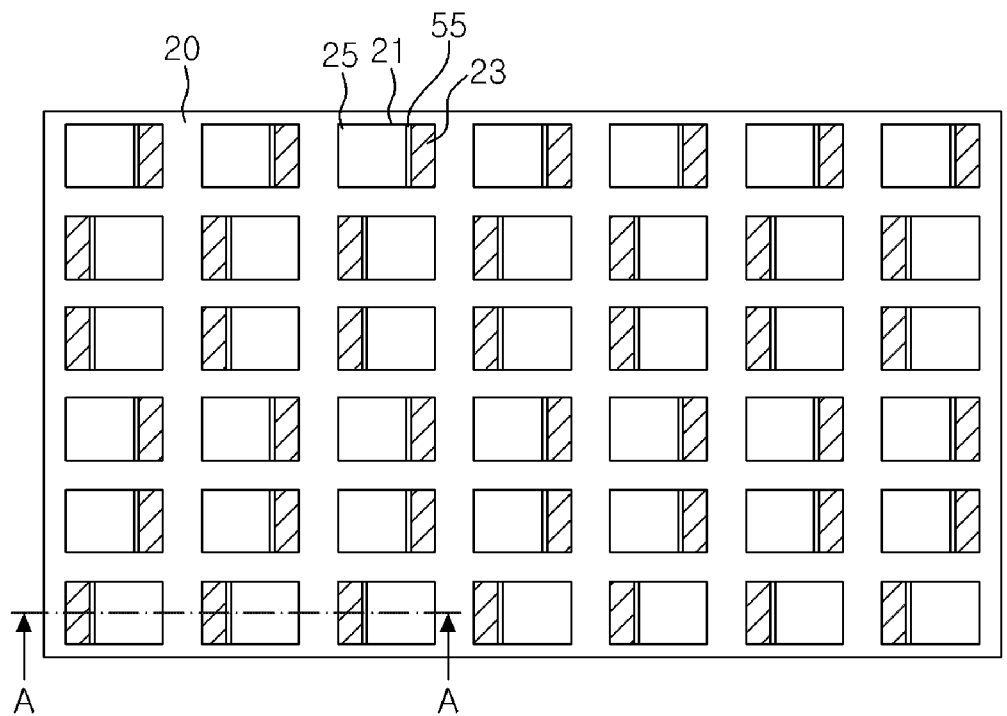
FIG. 1 is a plan view illustrating an LED having a plurality of light emitting cells according to an embodiment of the present invention.

DETAILED DESCRIPTION OF THE
ILLUSTRATED EMBODIMENTS

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2:
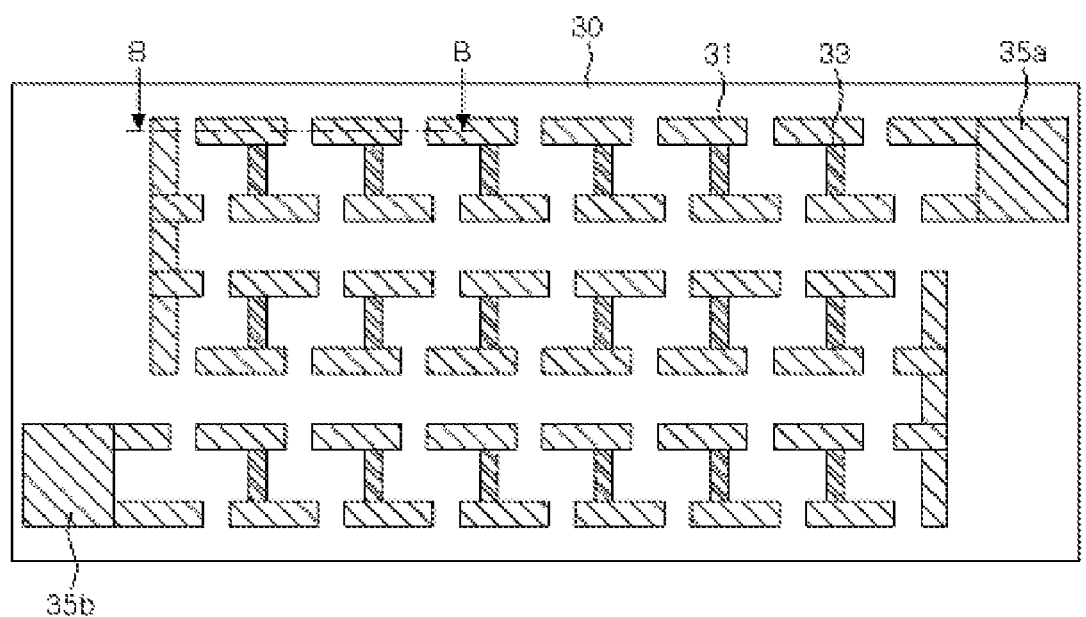
FIG. 2 is a plan view illustrating a submount onto which the LED is flip-bonded according to the embodiment of the present invention.
Figure 3:
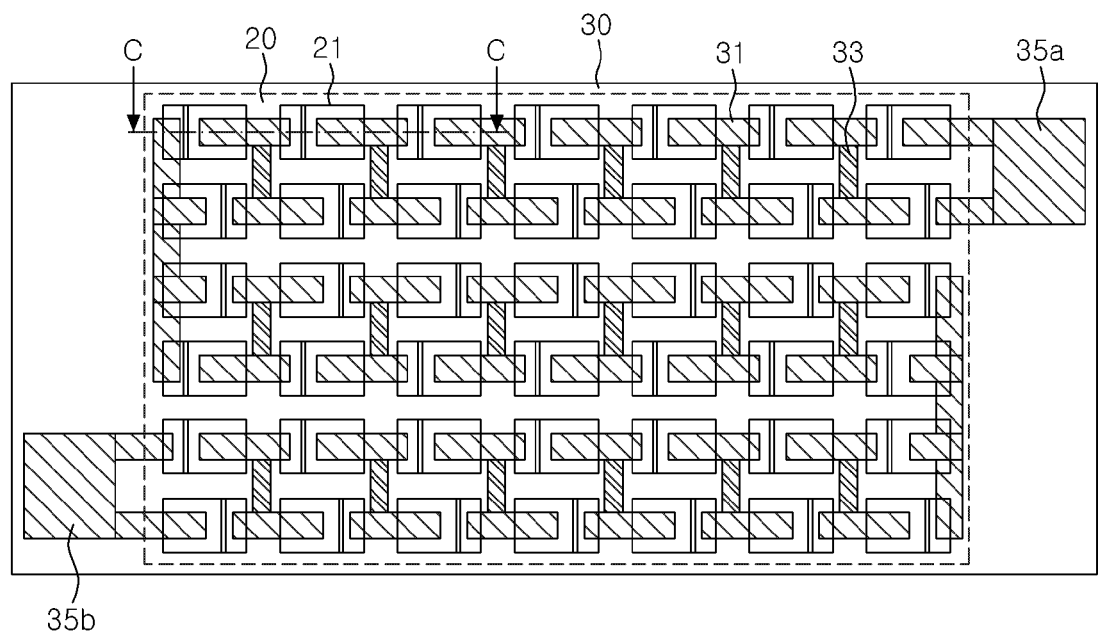
FIG. 3 is a schematic plan view illustrating an AC light emitting device in which the LED is flip-bonded to the submount according to the embodiment of the present invention.

FIG. 1 is a plan view illustrating an LED having a plurality of light emitting cells according to an embodiment of the present invention, FIG. 2 is a plan view illustrating a submount onto which the LED is flip-bonded according to the embodiment of the present invention, and FIG. 3 is a schematic plan view illustrating an AC light emitting device in which the LED is flip-bonded to the submount according to the embodiment of the present invention.

Referring to FIG. 1, a plurality of light emitting cells 21 are disposed on a substrate 20. Here, although the light emitting cells 21 are arranged in a 6×7 matrix pattern, the number and arrangement of the light emitting cells may vary. First-type and second-type electrodes 23 and 25 are exposed on each of the light emitting cells 21.

Referring to FIG. 2, bonding patterns 31 are arranged on a submount substrate 30. The bonding patterns 31 are formed corresponding to the light emitting cells 21 arranged on the substrate 20. That is, the bonding patterns 31 are arranged at an interval corresponding to the light emitting cells 21 so that the light emitting cells 21 arranged on the substrate 20 are flip-bonded.

Meanwhile, the bonding patterns 31 are connected by node connecting patterns 33. Although the node connecting patterns 33 and the bonding patterns 31 may be formed through the same process, the present invention is not limited thereto but may be formed through separate processes. Meanwhile, bonding pads 35a and 35b to be electrically connected to an external power source are formed at both sides of the bonding patterns 31.

Referring to FIG. 3, the light emitting cells 21 are flip-bonded on the bonding patterns 31. Here, portions respectively indicated by dotted lines A-A and B-B of FIGS. 1 and 2 correspond to a portion indicated by a dotted line C-C of FIG. 3. That is, the light emitting cells 21 of FIG. 1 are flip-bonded to the submount substrate 30 of FIG. 2. Here, the light emitting cells 21 at the portion indicated by the dotted line A-A of FIG. 1 are bonded to the bonding patterns 31 at the portion indicated by the dotted line B-B of FIG. 2.

A first serial array having the light emitting cells 21 connected in series and a second serial array connected in reverse parallel to the first serial array are formed through the bonding patterns 31. That is, first-type and second-type electrodes of two adjacent light emitting cells 21 are bonded to the same bonding pattern 31, thereby forming the serial arrays.

Meanwhile, since the node connecting patterns 33 connect the bonding patterns 31, the light emitting cells 21 in the first serial array are electrically connected to the corresponding light emitting cells 21 in the second serial array by the node connecting patterns 33.

Figure 4:
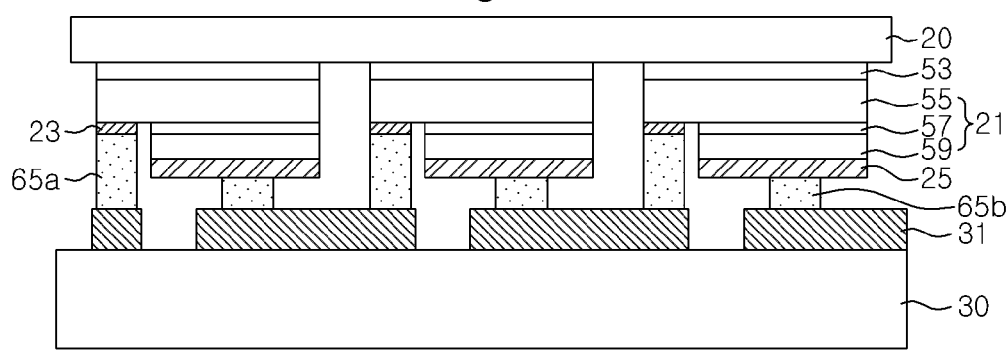
FIG. 4 is a sectional view taken along line C-C in FIG. 3.

FIG. 4 is a sectional view taken along line C-C in FIG. 3.

Referring to FIG. 4, the plurality of light emitting cells 21 are formed on the substrate 20. Each of the light emitting cells 21 comprises a first conductive-type semiconductor layer 55, a second conductive-type semiconductor layer 59 positioned on a region of the first conductive-type semiconductor layer 55, and an active layer 57 interposed between the first and second conductive-type semiconductor layers 55 and 59. Here, the terms first conductive-type and second conductive-type respectively represent N type and P type, or P type and N type.

The active layer 57 may be formed in a single or multiple quantum well structure, and the material and composition of the active layer 57 may be selected depending on a required light emitting wavelength. For example, the active layer 57 may be formed of a GaN-based compound semiconductor. Meanwhile, the first and second conductive-type semiconductor layers 55 and 59 may be formed of a material with a bandgap larger than the active layer 57, and may be formed of a GaN-based compound semiconductor.

Meanwhile, a buffer layer 53 may be interposed between the light emitting cell 21 and the substrate 50. The buffer layer 53 is employed to reduce lattice mismatch between the substrate 20 and the first conductive-type semiconductor layer 55. Although the buffer layers 53 may be spaced apart from one another as shown in this figure, the present invention is not limited thereto. That is, when the buffer layers 53 are formed of an insulative material or a material with large resistance, they may be continuously formed.

In the meantime, first-type electrodes 23 are formed on the exposed regions of the first conductive-type semiconductor layers 55, and second-type electrodes 25 are formed on the second conductive-type semiconductor layers 59. The first-type electrode 23 is in ohmic-contact with the first conductive-type semiconductor layer 55, and the second-type electrode 25 is in ohmic-contact with the second conductive-type semiconductor layer 59. Meanwhile, the second-type electrode 25 may include a reflective metal layer for reflecting light, which is directed to the submount substrate 30, toward the substrate 20.

Meanwhile, the bonding patterns 31 are disposed on the submount substrate 30. The first-type and second-type electrodes 23 and 25 are bonded to the bonding patterns 31 through first-type and second-type metal bumps 65a and 65b, respectively. At this time, the first-type electrode 23 of one of the light emitting cells 21 and the second-type electrode 25 of another of the light emitting cells adjacent thereto are bonded to the same bonding pattern 31 as shown in FIG. 3. Thus, an array of light emitting cells connected in series is formed.

Figure 5:
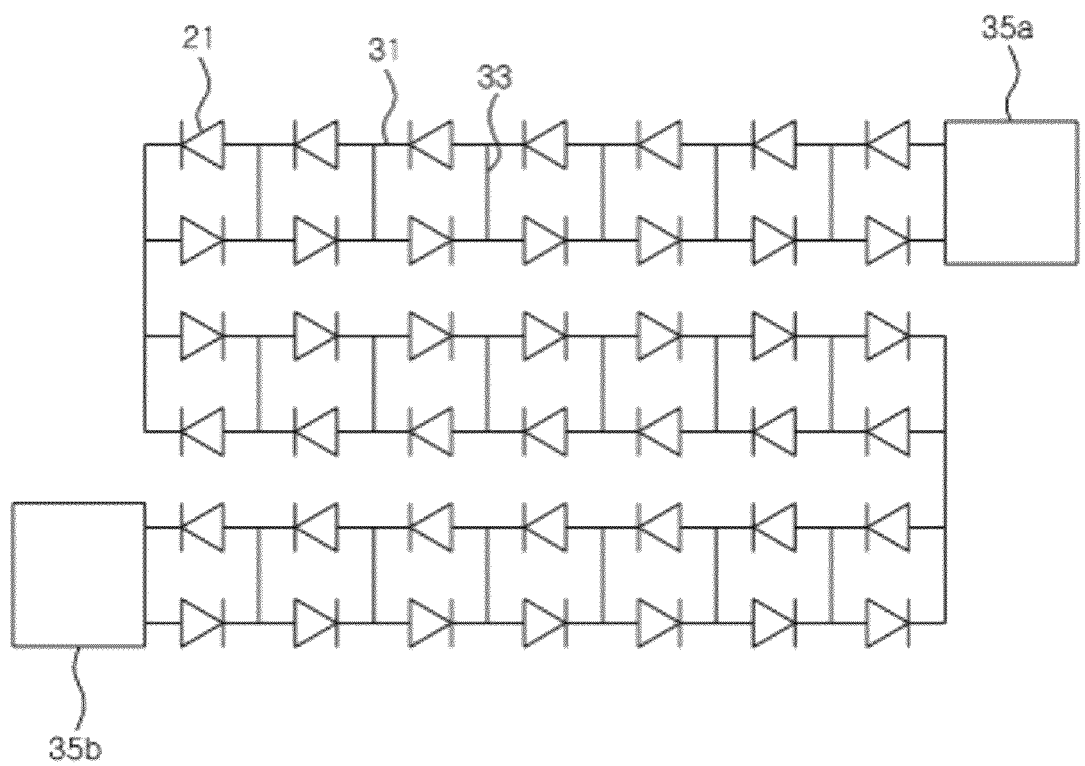
FIG. 5 is an equivalent circuit diagram of FIG. 3.

FIG. 5 is an equivalent circuit diagram of FIG. 3.

Referring to FIG. 5, first and second arrays of light emitting cells 21 are formed through the bonding patterns 31. The arrays are connected in reverse parallel to bonding pads 35a and 35b. Meanwhile, the node connecting patterns 33 connect nodes of the light emitting cells 21 corresponding to each other provided in the respective first and second arrays.

Hence, when forward voltage is applied to one serial array and reverse voltage is applied to the other serial array, the potential of a node between the light emitting cells 21 in the array to which the reverse voltage is applied is determined by the potential of a node between the light emitting cells 21 in the array to which the forward voltage is applied. As a result, it is possible to prevent excessive reverse voltage from being applied to a specific light emitting cell 21 in the array to which the reverse voltage is applied, thereby protecting the light emitting cells 21.

According to this embodiment, the nodes corresponding to each other provided in the respective first and second serial arrays are connected through the node connecting patterns 33 formed on the submount substrate 30. Accordingly, since the light emitting cells 21 formed on the substrate 20 need not share positive electrodes, the patterning process of forming light emitting cells 21 on a substrate can be simplified.

Figure 6:
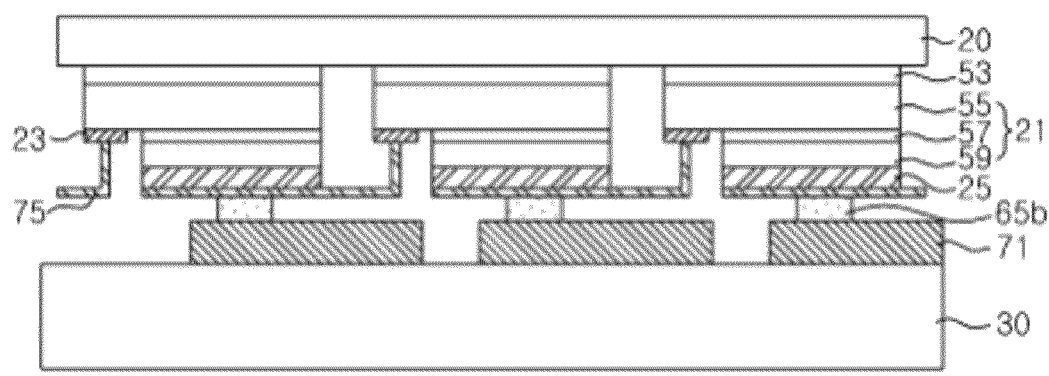
FIG. 6 is a sectional view illustrating an AC light emitting device according to another embodiment of the present invention.

Meanwhile, in this embodiment, the light emitting cells 21 formed on the substrate 20 are connected in series to the bonding patterns 31 formed on the submount substrate 30, thereby forming the serial arrays. However, the serial arrays of the light emitting cells 21 may be formed by wires. FIG. 6 is a sectional view illustrating an AC light emitting device, in which light emitting cells 21 are connected in series through wires 75 to thereby form serial arrays.

Referring to FIG. 6, in the same array, a first-type electrode 23 of one of light emitting cell 21 is connected to a second-type electrode 25 of an adjacent light emitting cell 21. The wires 75 may be formed using an air-bridge or step-cover process after forming the light emitting cells 21 and the first-type and second type electrodes 23 and 25. Further, the wires 75 may be formed together with the second-type electrodes 25.

First and second serial arrays, each of which has light emitting cells 21 connected in series through the wires 75, are formed on the substrate 20. The light emitting cells 21 are flip-bonded to bonding patterns 71 on a submount substrate 30 through second-type metal bumps 65b. At this time, the first-type metal bumps 65a (in FIG. 4) are omitted.

Meanwhile, node connecting patterns (not shown) are formed on the submount substrate 30 to connect the bonding patterns 71 such that nodes corresponding to each other provided in the respective first and second serial arrays are electrically connected to each other.

According to this embodiment, first-type metal bumps for connecting the first-type electrodes and bonding patterns may be omitted, thereby simplifying the process of flip-bonding light emitting cells.

The invention claimed is:

1. An alternating current (AC) light emitting device, in which a plurality of light emitting cells disposed on a substrate are flip-bonded to a submount substrate to be driven under an AC power source, the AC light emitting device comprising:
    a first serial array of light emitting cells;
    a second serial array of light emitting cells, the second serial array being connected in reverse parallel to the first serial array;
    bonding patterns disposed on the submount substrate, the light emitting cells of the first serial array and the second serial array being flip-bonded to the bonding patterns, at least one of the bonding patterns disposed on the submount substrate connecting a light emitting cell and an adjacent light emitting cell of the first array disposed on the substrate; and
    node connecting patterns disposed on the submount substrate, at least one of the node connecting patterns connecting one of the bonding patterns provided in the first serial array with another of the bonding patterns provided in the second serial array.

2. The AC light emitting device of claim 1, wherein the light emitting cells are bonded to the bonding patterns through metal bumps.

3. The AC light emitting device of claim 2, wherein each of the light emitting cells comprises a first conductive-type semiconductor layer, a second conductive-type semiconductor layer, and an active layer interposed between the first conductive-type semiconductor layer and the second conductive-type semiconductor layer,
    the metal bumps comprise first-type metal bumps for connecting the first conductive-type semiconductor layers of the light emitting cells and the bonding patterns, and second-type metal bumps for connecting the second conductive-type semiconductor layers of the light emitting cells and the bonding patterns, and
    the first conductive-type semiconductor layer of one of the light emitting cells and the second conductive-type semiconductor layer of another of the light emitting cells adjacent thereto are respectively connected on the same bonding pattern through the first-type metal bump and the second-type metal bump.

4. The AC light emitting device of claim 2, wherein each of the light emitting cells comprises a first conductive-type semiconductor layer, a second conductive-type semiconductor layer, and an active layer interposed between the first conductive-type semiconductor layer and the second conductive-type semiconductor layer,
    the first conductive-type semiconductor layer of one of the light emitting cells and the second conductive-type semiconductor layer of another of the light emitting cell adjacent thereto are connected by a wire formed on the substrate, and
    the metal bumps connect the second conductive-type semiconductor layers and the bonding patterns.

5. The AC light emitting device of claim 1, wherein the bonding patterns and the node connecting patterns are formed using the same process.

6. The AC light emitting device of claim 1, further comprising bonding pads disposed on the submount substrate at distal ends of the bonding patterns, the bonding pads to be electrically connected to an external power source.

7. The AC light emitting device of claim 3, wherein a first-type electrode is disposed on the first conductive-type semiconductor layer and a second-type electrode is disposed on the second-type semiconductor layer.

8. The AC light emitting device of claim 4, wherein a first-type electrode is disposed on the first conductive-type semiconductor layer and a second-type electrode is disposed on the second-type semiconductor layer.

9. The AC light emitting device of claim 3, further comprising a buffer layer interposed between the substrate and the first conductive-type semiconductor layer.

10. The AC light emitting device of claim 4, further comprising a buffer layer interposed between the substrate and the first conductive-type semiconductor layer.

11. An alternating current (AC) light emitting device, comprising:
a first serial light emitting cell array disposed on a single substrate, the first serial light emitting cell array comprising at least a first light emitting cell and a second light emitting cell;
a second serial light emitting cell array disposed on the substrate, the second serial light emitting cell array comprising at least a third light emitting cell and a fourth light emitting cell and being connected in reverse parallel to the first serial light emitting cell array;
a plurality of bonding patterns disposed on a submount substrate and flip-bonded to the first serial light emitting cell array and the second serial light emitting cell array, a first bonding pattern of the plurality of bonding patterns disposed on the submount substrate and connecting a first-type semiconductor layer of the first light emitting cell and a second-type semiconductor layer of the second light emitting cell disposed on the substrate, and a second bonding pattern of the plurality of bonding patterns disposed on the submount substrate and connecting a first-type semiconductor layer of the third light emitting cell and a second-type semiconductor layer of the fourth light emitting cell disposed on the substrate; and
a plurality of node connecting patterns disposed on the submount substrate, a first node connecting pattern of the plurality of node connecting patterns connecting the first bonding pattern and the second bonding pattern, wherein each node connecting pattern connects one of the bonding patterns provided in the first serial light emitting cell array with another of the bonding patterns provided in the second serial light emitting cell array.

12. The AC light emitting device of claim 11, wherein the corresponding nodes comprise negative electrodes.

13. The light emitting device of claim 11, wherein the first light emitting cell and the second light emitting cell are each connected to the first bonding pattern through a metal bump, and the third light emitting cell and the fourth light emitting cell are connected to the second bonding pattern through a metal bump.

14. The light emitting device of claim 11, wherein the first light emitting cell and the second light emitting cell are connected to each other through a wire, and the third light emitting cell and the fourth light emitting cell are connected to each other through a wire.

15. The light emitting device of claim 11, further comprising bonding pads, wherein the submount substrate comprises four corners and the bonding pads are disposed at diagonally opposite corners of the submount substrate, the bonding pads to be electrically connected to an external power source.

16. The light emitting device of claim 11, wherein the plurality of bonding patterns comprises at least one bonding pattern that connects two light emitting cells in the first array and two light emitting cells in the second array, the at least one bonding pattern being disposed in a substantially straight line.

17. The light emitting device of claim 13, wherein the metal bumps connecting the first light emitting cell and the second light emitting cell to the first bonding pattern directly contact the first bonding pattern, and the metal bumps connecting the third light emitting cell and the fourth light emitting cell to the second bonding pattern directly contact the second bonding pattern.

18. The light emitting device of claim 17, wherein the first node connecting pattern directly contacts the first bonding pattern and the second bonding pattern.

19. The light emitting device of claim 14, further comprising metal bumps, wherein the wire connecting the first light emitting cell and the second light emitting cell is connected to the first bonding pattern through a first metal bump, and the wire connecting the third light emitting cell and the fourth light emitting cell is connected to the second bonding pattern through a second metal bump.

20. The light emitting device of claim 19, wherein the first metal bump directly contacts the first bonding pattern and the wire connecting the first light emitting cell and the second light emitting cell, and the second metal bump directly contacts the second bonding pattern and the wire connecting the third light emitting cell and the fourth light emitting cell.

* * * * *